(12) United States Patent
Kobayashi et al.

(10) Patent No.: US 10,738,195 B2
(45) Date of Patent: Aug. 11, 2020

(54) TRANSLUCENT RESIN MEMBER

(71) Applicant: Koito Manufacturing Co., Ltd., Tokyo (JP)

(72) Inventors: Masayuki Kobayashi, Shizuoka (JP); Hideaki Yamamoto, Shizuoka (JP); Aya Shinohara, Shizuoka (JP)

(73) Assignee: KOITO MANUFACTURING CO., LTD., Tokyo (JP)

(*) Notice: Subject to any disclaimer, the term of this patent is extended or adjusted under 35 U.S.C. 154(b) by 543 days.

(21) Appl. No.: 14/792,818

(22) Filed: Jul. 7, 2015

(65) Prior Publication Data

US 2016/0017488 A1 Jan. 21, 2016

(30) Foreign Application Priority Data

Jul. 17, 2014 (JP) .................. 2014-146682

(51) Int. Cl.
| | |
|---|---|
| *C09D 1/00* | (2006.01) |
| *C09D 133/00* | (2006.01) |
| *C09D 4/00* | (2006.01) |
| *C23C 16/30* | (2006.01) |
| *C08K 3/34* | (2006.01) |
| *C09D 133/06* | (2006.01) |

(52) U.S. Cl.
CPC .............. *C09D 1/00* (2013.01); *C08K 3/34* (2013.01); *C09D 4/00* (2013.01); *C09D 133/00* (2013.01); *C23C 16/30* (2013.01); *C09D 133/06* (2013.01)

(58) Field of Classification Search
None
See application file for complete search history.

(56) References Cited

U.S. PATENT DOCUMENTS 5,157,527 A * 10/1992 De Keyzer ....... G02F 1/133345
349/106
5,318,850 A * 6/1994 Pickett ................. C09D 4/00
428/412

(Continued)

FOREIGN PATENT DOCUMENTS

JP   2008045160 A  *  2/2008
JP   2011-126026 A     6/2011

(Continued)

OTHER PUBLICATIONS

JP 2008-045160 English Machine Translation (Year: 2008).*

(Continued)

*Primary Examiner* — Scott R. Walshon
*Assistant Examiner* — Elaine M Vazquez
(74) *Attorney, Agent, or Firm* — Abelman, Frayne & Schwab

(57) ABSTRACT

Provided is a translucent resin member including: an acrylic hard coat layer, a $SiO_X$ layer ($1.2<X<2$), and a $Si_{(1-Y)}C_YO_X$ layer ($0<Y<1$, $1.2<X<2$) sequentially provided on a polycarbonate (PC) substrate. The acrylic hard coat layer may be UV-cured in the absence of oxygen. The $SiO_X$ layer may be formed by deposition. The $Si_{(1-Y)}C_YO_X$ layer may be formed by plasma chemical vapor deposition (CVD).

10 Claims, 1 Drawing Sheet

(56) References Cited

U.S. PATENT DOCUMENTS

| | | | |
|---|---|---|---|
| 7,811,669 B2 * | 10/2010 | Fujii | C23C 14/0021 |
| | | | 427/255.18 |
| 2007/0026235 A1 * | 2/2007 | Chen | C08J 7/04 |
| | | | 428/411.1 |
| 2015/0240354 A1 * | 8/2015 | Han | C23C 16/401 |
| | | | 428/446 |

FOREIGN PATENT DOCUMENTS

| | | |
|---|---|---|
| JP | 5336016 B1 | 8/2013 |
| KR | 10-1046897 B1 | 7/2011 |

OTHER PUBLICATIONS

An Office Action dated Sep. 21, 2016, issued from the Korean Patent Office (KIPO) of Korean Patent Application No. 10-2015-0100907 and an English translation thereof.

* cited by examiner

TRANSLUCENT RESIN MEMBER

CROSS-REFERENCE TO RELATED APPLICATIONS

This application is based on and claims priority from Japanese Patent Application No. 2014-146682, filed on Jul. 17, 2014, with the Japan Patent Office, the disclosure of which is incorporated herein in its entirety by reference.

TECHNICAL FIELD

The present disclosure relates to a translucent resin member, and more particularly, to a translucent resin member that is excellent in weather resistance, abrasion resistance, durability, productivity, and alkali (chemical) resistance.

BACKGROUND

In recent years, a translucent resin, in particular, polycarbonate (PC) has been widely used as a lens for a vehicle lamp, due to its easy moldability into various shapes and lightweight.

In addition, although inorganic glass, mainly composed of silicic acid, is commonly used as a window member for a transportation unit including a vehicle, PC has been considered as a substitute for the inorganic glass and practically used in some fields for the same reason as in the lens for the vehicle lamp and due to its lighter weight and higher impact resistance, compared with the inorganic glass.

Meanwhile, PC has disadvantages of low weather resistance, such as secular degradation caused by ultraviolet (UV) light and a reduced transmittance due to yellowing, and low abrasion resistance, such as a surface susceptible to damage. Such disadvantages may be solved by forming a silicon-based hard coat layer on a PC substrate and additionally forming thereon a silicon dioxide ($SiO_2$) layer by a plasma chemical vapor deposition (CVD).

However, the aforementioned silicon-based hard coat layer is formed by thermal curing. The silicon-based hard coat layer is subjected to the thermal curing for a relatively long period of time, for example, 30 minutes to 60 minutes. Therefore, using the silicon-based hard coat layer may lead to low productivity and high manufacturing costs.

Japanese Patent Laid-Open Publication No. 2011-126026 discloses a translucent resin member in which an acrylic hard coat layer is used in place of the silicon-based hard coat layer, that is, an acrylic hard coat layer and a $SiO_2$ layer formed by plasma CVD are sequentially provided on a PC substrate. Since the curing of the acrylic hard coat layer is completed within a few minutes, using the acrylic hard coat layer may achieve enhanced productivity and reduced manufacturing costs.

SUMMARY

It is appreciated in the translucent resin member disclosed in Japanese Patent Laid-Open Publication No. 2011-126026 that the weather resistance, abrasion resistance, productivity, and thermal resistance thereof are excellent while the alkali resistance thereof is unsatisfactory. In particular, issues of the exposure to alkali and the peeling-off of a surface of the $SiO_2$ layer arise therein.

In this regard, an object of the present disclosure is to provide a translucent resin member using PC which is excellent in weather resistance, abrasion resistance, productivity, thermal resistance, and moisture resistance, and furthermore, is improved in alkali resistance as well.

The present inventors have intensively studied and found that the aforementioned issues may be solved by the following configuration.

Hereinafter, an exemplary embodiment of the present disclosure will be described.

(1) A translucent resin member comprising: an acrylic hard coat layer, a $SiO_X$ layer ($1.2<X<2$), and a $Si_{(1-Y)}C_YO_X$ layer ($0<Y<1$, $1.2<X<2$) sequentially provided on a polycarbonate (PC) substrate.

(2) The translucent resin member of (1), wherein the acrylic hard coat layer is UV-cured in the absence of oxygen.

(3) The translucent resin member of (1) or (2), wherein the $SiO_X$ layer ($1.2<X<2$) is formed by deposition.

(4) The translucent resin member of any one of (1) to (3), wherein the $Si_{(1-Y)}C_YO_X$ layer ($0<Y<1$, $1.2<X<2$) is formed by plasma chemical vapor deposition (CVD).

In general, a surface of an acrylic hard coat layer is susceptible to plasma. In addition, a $Si_{(1-Y)}C_YO$ layer transmits an alkaline solution. Accordingly, in a translucent resin member in which an acrylic hard coat layer and a $Si_{(1-Y)}C_YO$ layer formed by a plasma CVD process are sequentially provided on a PC substrate, a surface of an acrylic hard coat layer is exposed to plasma and damaged during the formation of the $Si_{(1-Y)}C_YO$ layer directly on the surface of the acrylic hard coat layer. When the translucent resin member is exposed to an alkaline solution, the alkaline solution transmits the $Si_{(1-Y)}C_YO$ layer and elutes the surface of the acrylic hard coat layer, which is damaged by the plasma. Further, the $Si_{(1-Y)}C_YO$ layer is peeled off from the surface of the acrylic hard coat layer.

In this regard, a translucent resin member according to the exemplary embodiment may have a layer formed of $SiO_X$ ($1.2<X<2$) which has plasma resistance (hereinafter, referred to as a "$SiO_X$ layer") and a layer formed of $Si_{(1-Y)}C_YO_X$ ($0<Y<1$, $1.2<X<2$) (hereinafter, referred to as a "$Si_{(1-Y)}C_YO_X$ layer") which are sequentially provided on an acrylic hard coat layer.

The $SiO_X$ layer (film) formed on the acrylic hard coat layer by deposition is a silica ($SiO_2$) layer (film) which does not damage the hard coat layer during the film formation thereof. A surface of the acrylic hard coat layer directly below the $SiO_X$ layer may not be damaged by plasma.

Accordingly, in the exemplary embodiment, the $Si_{(1-Y)}C_YO_X$ layer is further formed on the $SiO_X$ layer which is formed on the acrylic hard coat layer. The $Si_{(1-Y)}C_YO_X$ layer is a dense silica layer formed by plasma CVD.

In the exemplary embodiment, since the formation of the $Si_{(1-Y)}C_YO_X$ layer by the plasma CVD is performed on the $SiO_X$ layer, which is formed by deposition, rather than directly on the acrylic hard coat layer, the surface of the acrylic hard coat layer may not be damaged by the plasma. In addition, when the translucent resin member is exposed to the alkaline solution, a transmission amount of the alkaline solution arriving at the acrylic hard coat layer may be minimized by providing the dense $Si_{(1-Y)}C_YO_X$ layer as an uppermost layer.

The translucent resin member according to the exemplary embodiment may further be enhanced in the alkali resistance, in addition to the weather resistance, abrasion resistance, productivity, thermal resistance, and moisture resistance.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, an exemplary embodiment with respect to the translucent resin member will be more clearly understood from the following description taken in conjunction with the accompanying drawings.

Figure 1:
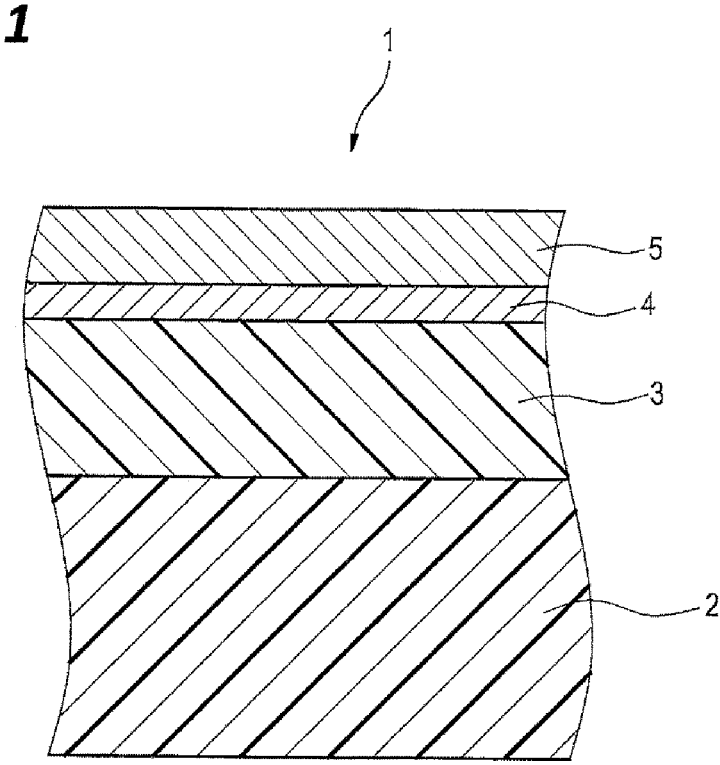
FIG. 1 is a schematic cross-sectional view illustrating an example of the translucent resin member according to the exemplary embodiment.

An example of the translucent resin member according to the exemplary embodiment is described with reference to the schematic cross-sectional view of FIG. 1.

A translucent resin member 1 according to the exemplary embodiment may have an acrylic hard coat layer 3, a $SiO_X$ layer 4, and a $Si_{(1-Y)}C_YO_X$ layer 5 which are sequentially provided on a PC substrate 2.

The PC substrate 2 used in the translucent resin member 1 according to the exemplary embodiment is not particularly limited as long as a desired level of the transparency and strength thereof is guaranteed. A thickness of the PC substrate 2 may also be appropriately determined based on the purpose of use, form, and specifications thereof.

The acrylic hard coat layer 3 of the translucent resin member 1 according to the exemplary embodiment may include an acrylic resin cured film having a UV light shielding function, to thereby suppress an influence of a UV light, for example, a decrease in the transmittance due to yellowing, on the PC substrate 2 and enhance the weather resistance of the translucent resin member 1.

The acrylic hard coat layer 3 may contain a UV light absorber, such as benzotriazole-based UV light absorber, or a hindered amine-based light stabilizer. An amount of a UV light induced to the PC substrate 2 may be reduced by an amount of a UV light absorbed by the UV light absorbers dispersed in the acrylic hard coat layer 3, such that a decrease in transmittance due to yellowing of the PC substrate 2 may be suppressed.

The acrylic hard coat layer 3 may have a hardness equivalent to a pencil hardness grade "H."

The acrylic hard coat layer 3 may be formed as the acrylic resin cured layer by coating a monomer solution containing (meth)acrylic ester, which is a monomer component, and a polymerization initiator on the PC substrate 2, and performing a polymerization reaction of the monomer component by UV irradiation.

In a case of performing the polymerization reaction of the monomer component by UV irradiation, the polymerization reaction may be performed in the absence of oxygen.

By performing the polymerization reaction in the absence of oxygen, the alkali resistance thereof may further be enhanced.

As used herein, the expression "in the absence of oxygen" refers to a state in which a concentration of oxygen is less than or equal to 1%. Polymerization reaction processes performed in the absence of oxygen are not particularly limited, and may generally include a process performed under an inert gas atmosphere such as nitrogen, or a lamination process using a gas barrier film.

The $SiO_X$ layer 4 in the translucent resin member 1 according to the exemplary embodiment may be formed between the acrylic hard coat layer 3 and the $Si_{(1-Y)}C_YO_X$ layer 5 which will be described further below.

In the $SiO_X$ layer 4, the value "X" in $SiO_X$ is in a range of $1.2<X<2$.

The $SiO_X$ layer 4 may be formed by deposition.

Owing to the presence of the $SiO_X$ layer 4, the aforementioned acrylic hard coat layer 3 may avoid the damage caused by plasma during the formation of the $Si_{(1-Y)}C_YO_X$ layer 5, which is an outermost layer of the translucent resin member 1 according to the exemplary embodiment.

Since the $SiO_X$ layer 4 is formed by deposition, the surface of the acrylic hard coat layer 3 may not be damaged during the formation of the $SiO_X$ layer 4.

A thickness of the $SiO_X$ layer 4 is not particularly limited, and may be in a range of 100 nm to 500 nm.

The $Si_{(1-Y)}C_YO_X$ layer 5 in the translucent resin member 1 according to the exemplary embodiment may be formed on the $SiO_X$ layer 4.

In the $Si_{(1-Y)}C_YO_X$ layer 5, the value "X" in $Si_{(1-Y)}C_YO_X$ is in a range of $1.2<X<2$, similarly to the $SiO_X$ layer 4, and the value "Y" therein is in a range of $0<Y<1$.

The $Si_{(1-Y)}C_YO_X$ layer 5 may be formed by plasma CVD.

In addition, the surface of the $SiO_X$ layer 4 may be subjected to a cleaning treatment prior to the formation of the $Si_{(1-Y)}C_YO_X$ layer 5.

The cleaning treatment, in particular, an $O_2$ plasma treatment, may be performed at 100 watts (W) for 3 min.

A thickness of the $Si_{(1-Y)}C_YO_X$ layer 5 is not particularly limited, and may be in a range of 0.5 µm to 30 µm.

The translucent resin member 1 according to the exemplary embodiment is not particularly limited on its use and may be used in various applications. Among the various applications thereof, applications for a lens of a vehicle lamp and a vehicle window member are particularly expected.

Figure 2:
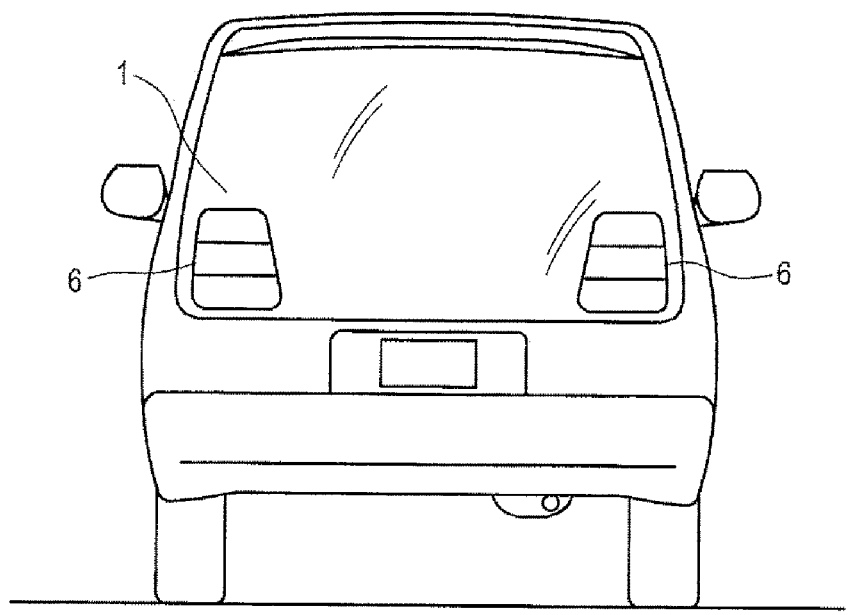
FIG. 2 is a schematic view illustrating an exemplary usage of the translucent resin member according to the exemplary embodiment.

In addition, the translucent resin member 1 according to the exemplary embodiment may also be applied in such a manner that a rear window member and a lens of a vehicle lamp 6 are integrally formed as illustrated in FIG. 2.

Exemplary Embodiment

Hereinafter, results of evaluation tests based on Inventive Examples and Comparative Examples are provided to describe the exemplary embodiment in greater detail. In addition, the scope of the present disclosure is not limited to the examples.

Example 1

(Formation of Acrylic Hard Coat Layer)

A coating solution for a hard coat layer having a composition described below was coated on a 150×150×3 mm PC substrate to have a thickness of 10 µm subsequent to curing, and an infrared (IR) setting process and a UV curing process were sequentially performed under the following conditions, to form an acrylic hard coat layer.

(Coating Solution for Hard Coat Layer)

An acrylic resin paint having a UV light shielding function, which is manufactured by Mitsubishi Rayon Co., Ltd. (registered trademark: Acryking)

(IR Setting)
Belt length: 2,000 mm
Conveyance speed: 15 mm/s (processing time=90 seconds)
IR heater setting: 80° C.
Gap between heater/substrate: 10 cm (UV Curing)
Lamp: HAN-250 NL (mercury lamp)
Conveyance speed: 5.1 m/min
UV intensity: 800 mW/cm$^2$ (UD-N36)
Integrated light: 2,100 mJ/cm (UV-351)
Oxygen concentration: 0.3 to 0.9% (N$_2$ purge)

(Formation of SiO$_X$ layer)

On the acrylic hard coat layer formed as above, an electron beam (EB) deposition process was performed under the following conditions, so that a SiO$_X$ layer having a film thickness of 0.2 µm was formed.

(EB Deposition)
Raw material used: SiO$_2$ granular raw material
Film formation rate: 5 Å/S
Plasma-assisted film formation (RF at 600 W, neutralizer ON, and bias at 200 V)

(Formation of Si$_{(1-Y)}$C$_Y$O$_X$ Layer)

On the SiO$_X$ layer formed as above, a cleaning treatment was performed using O$_2$ plasma (at 100 W for 3 minutes), and a plasma CVD process was performed under the following conditions, so that a Si$_{(1-Y)}$C$_Y$O$_X$ layer having a film thickness of 2.6 µm was formed.

(Plasma CVD)
Device used: PLASMA CLEAN PCR-1008SR manufactured by Daido Steel Co., Ltd.
Vacuum pump: LEYBOLD D65BCS (rotary pump)
EDWARDS EH500 (mechanical booster pump)
Interior measurement of chamber: 400 (L)×400 (W)×500 (D) mm (80 L)
Vacuum gauge: CCMH-10A (sensor) and GM-2001 (display) manufactured by ULVAC Inc.
Hexamethyldisiloxane (raw material): 7 sccm
Oxygen: 15 sccm
Process pressure: 13 Pa
RF output: 100 W
Process time: 40 min (Alkali Resistance Test)

After a 0.1 N sodium hydroxide (NaOH) aqueous solution was maintained in contact with a part of the surface (Si$_{(1-Y)}$C$_Y$O$_X$ layer surface) of the translucent resin member manufactured as above for 4 hours at 55° C., a peeling-off state of each layer on the PC substrate was observed.

As a result, the peeling-off of each layer on the PC substrate was not observed.

Example 2

A translucent resin member was manufactured and an alkali resistance test was performed in the same manner as in Example 1, except that the cleaning treatment by the O$_2$ plasma was absent at the time of forming the Si$_{(1-Y)}$C$_Y$O$_X$ layer and a thickness of the Si$_{(1-Y)}$C$_Y$O$_X$ layer was set to 2.3 µm. As a result, the peeling-off of each layer on a PC substrate was not observed, similarly to Example 1.

Comparative Example 1

A translucent resin member was manufactured and an alkali resistance test was performed in the same manner as in Example 1, except that the Si$_{(1-Y)}$C$_Y$O$_X$ layer was not formed. The peeling-off of each layer on a PC substrate was observed in a portion in contact with the NaOH aqueous solution and a portion adjacent thereto.

A height difference between the portion in contact with the NaOH aqueous solution and the portion not in contact therewith was 0.4 µm.

Comparative Example 2

A translucent resin member was manufactured and an alkali resistance test was performed in the same manner as in Example 1, except that a thickness of the Si$_{(1-Y)}$C$_Y$O$_X$ layer was set to 2.2 µm, and a deposition process was performed under the following condition to form a SiO layer having a thickness of 0.2 µm in place of the SiO$_X$ layer. As a result, the expansion of each layer on the PC substrate and the slight peeling-off thereof were observed.

A height difference between a portion in contact with the NaOH aqueous solution and a portion not in contact therewith was 2.4 µm.

(EB Deposition)
Raw material used: SiO powder raw material
Film formation rate: 5 Å/S
Plasma-assisted film formation (RF at 600 W, neutralizer ON, and bias at 200 V)

The translucent resin members of Examples 1 and 2 were excellent in alkali resistance, as compared with Comparative Examples 1 and 2.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A translucent resin member comprising:
an acrylic hard coat layer, a SiO$_X$ layer (1.2<X<2), and a Si$_{(1-Y)}$C$_Y$O$_X$ layer (0<Y<1, 1.2<X<2) sequentially provided on a polycarbonate (PC) substrate,
wherein an oxygen component of the SiO$_X$ layer, and a carbon component and an oxygen component of the Si$_{(1-Y)}$C$_Y$O$_X$ layer are adjusted such that a peeling-off of each of the acrylic hard coat layer, the SiO$_X$ layer and the Si$_{(1-Y)}$C$_Y$O$_X$ layer on the PC substrate is suppressed when an alkaline solution is maintained in contact with a surface of the Si$_{(1-Y)}$C$_Y$O$_X$ layer, and
wherein the acrylic hard coat layer is UV-cured in the absence of oxygen, such that an alkali resistance is enhanced, and
wherein a thickness of the Si$_{(1-Y)}$C$_Y$O$_X$ layer (0<Y<1, 1.2<X<2) is in a range of 2.3 µm to 30 µm.

2. The translucent resin member of claim 1, wherein the Si$_{(1-Y)}$C$_Y$O$_X$ layer (0<Y<1, 1.2<X<2) is formed by plasma chemical vapor deposition (CVD).

3. The translucent resin member of claim 1, wherein the SiO$_X$ layer (1.2<X<2) is formed by deposition.

4. The translucent resin member of claim 3, wherein the Si$_{(1-Y)}$C$_Y$O$_X$ layer (0<Y<1, 1.2<X<2) is formed by plasma chemical vapor deposition (CVD).

5. The translucent resin member of claim 1, wherein a surface of the SiO$_X$ layer (1.2<X<2) is treated with a cleaning treatment including an O2 plasma treatment before the Si$_{(1-Y)}$C$_Y$O$_X$ layer (0<Y<1, 1.2<X<2) is formed.

6. The translucent resin member of claim 1, wherein the acrylic hard coat layer is UV-cured under one selected from the group consisting of an inert gas atmosphere and a lamination process using a gas barrier film.

7. The translucent resin member of claim 1, wherein a thickness of the $SiO_X$ layer ($1.2<X<2$) is in a range of 100 nm to 500 nm.

8. The translucent resin member of claim 1, wherein the acrylic hard coat layer includes a UV light absorber.

9. The translucent resin member of claim 8, the UV light absorber is a benzotriazole-based UV light absorber.

10. The translucent resin member of claim 8, the UV light absorber is a hindered amine-based UV light stabilizer.

\* \* \* \* \*